United States Patent [19]
Burns et al.

[11] Patent Number: 5,416,859
[45] Date of Patent: May 16, 1995

[54] BROADBAND, LOW DRIVE VOLTAGE, ELECTROOPTIC, INTERGRATED OPTICAL MODULATOR

[75] Inventors: William R. Burns, Alexandria; Catherine H. Bulmer, Springfield; Ganesh K. Gopalakrishnan, Lorton, all of Va.

[73] Assignee: The United States of America as represented by the Secretary of the Navy, Washington, D.C.

[21] Appl. No.: 46,293

[22] Filed: Apr. 14, 1993

[51] Int. Cl.⁶ .................................................. G02B 6/10
[52] U.S. Cl. .................................................. 385/3; 385/8
[58] Field of Search .................................................. 385/1–9

[56] References Cited

U.S. PATENT DOCUMENTS

| | | | |
|---|---|---|---|
| 4,693,549 | 9/1987 | Cheo | 385/9 |
| 5,004,313 | 4/1991 | Ty Tan et al. | 385/2 |
| 5,076,655 | 12/1991 | Bridges | 385/3 |
| 5,129,017 | 7/1992 | Kawano et al. | 385/3 |

OTHER PUBLICATIONS

C. H. Bulmer et al., "Broadband, Traveling Wave Phase An Amplitude Modulators For Photonics Applications", presented at 2nd Annual Darpa/Rome Laboratory Symposium On Photonics Systems For Antenna Applications, Naval Postgraduate School, Monterey, Calif. Dec. 10–12, 1991.
Gopalakrishnan et al., "Electrical Loss Mechanisms In Traveling Wave LiNbO₃ Optical Modulators", printed in Electronics Letters, vol. 28, No. 2, Jan 16, 1992, pp. 207–209.
Gopalakrishnan et al., "40 GHz Low Half–Wave Voltage Ti:LiNbO₃ Intensity Modulator", printed in Electronics Letters, vol. 28, No. 9, Apr. 23, 1992 pp. 826–827.
M. Seino et al., "20 GHz 3 dB Bandwidth Ti:LiNbO₃ Mach–Zehnder Modulator", Ecoc, 1990, paper ThG1-5.

Primary Examiner—Rodney B. Bovernick
Assistant Examiner—John Ngo
Attorney, Agent, or Firm—Thomas E. McDonnell; George Jameson

[57] ABSTRACT

A broadband, electrooptic modulator is disclosed which, in a first embodiment, comprises: a substrate having substrate modes, having electrooptic effects, and having a first optical waveguide adapted to receive and transmit light therethrough in a first direction and with a first phase velocity; a buffer layer disposed on the substrate; and a coplanar waveguide electrode structure having a coplanar mode and being disposed on the buffer layer for receiving an electrical signal propagating therethrough in the first direction with a second phase velocity to phase modulate the light in the optical waveguide at a frequency in the range from 0 Hz up to substantially 40 GHz. The substrate has a sufficiently small thickness so that coupling between the coplanar mode of the coplanar waveguide electrode structure and any one of the substrate modes of the substrate substantially does not occur over a desired frequency bandwidth of operation, and the coplanar waveguide electrode structure has a sufficiently large thickness so that the second phase velocity of the electrical signal is substantially equal to the first phase velocity. In a second embodiment of the invention an intensity modulator is produced by adding a second optical waveguide which, in combination with the first optical waveguide, forms an interferometer.

27 Claims, 9 Drawing Sheets

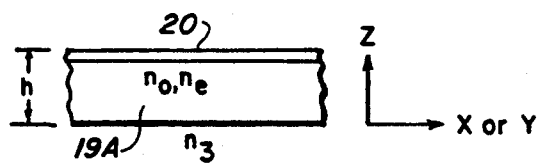
FIG. 2A
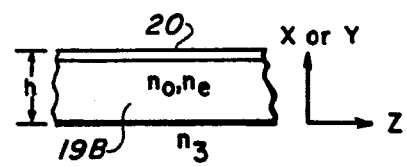
FIG. 2B
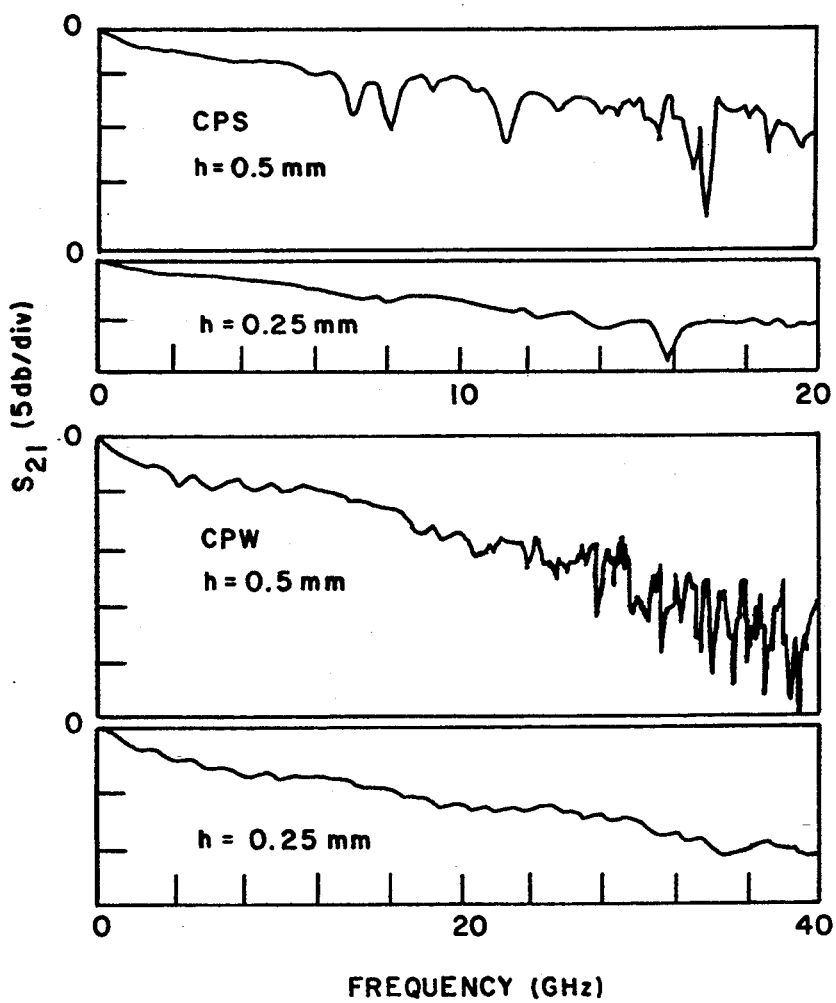
FIG. 3A
FIG. 3B
FIG. 3C
FIG. 3D

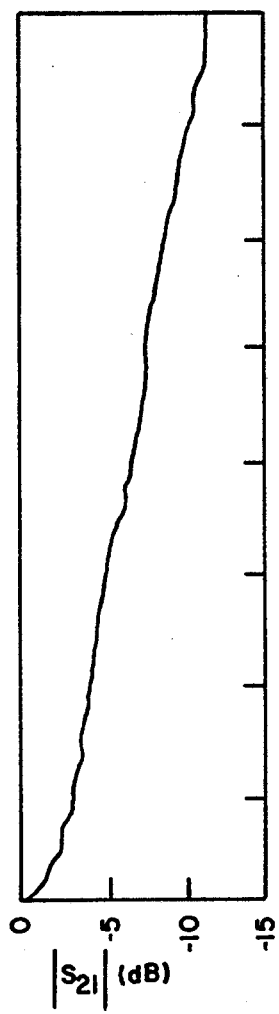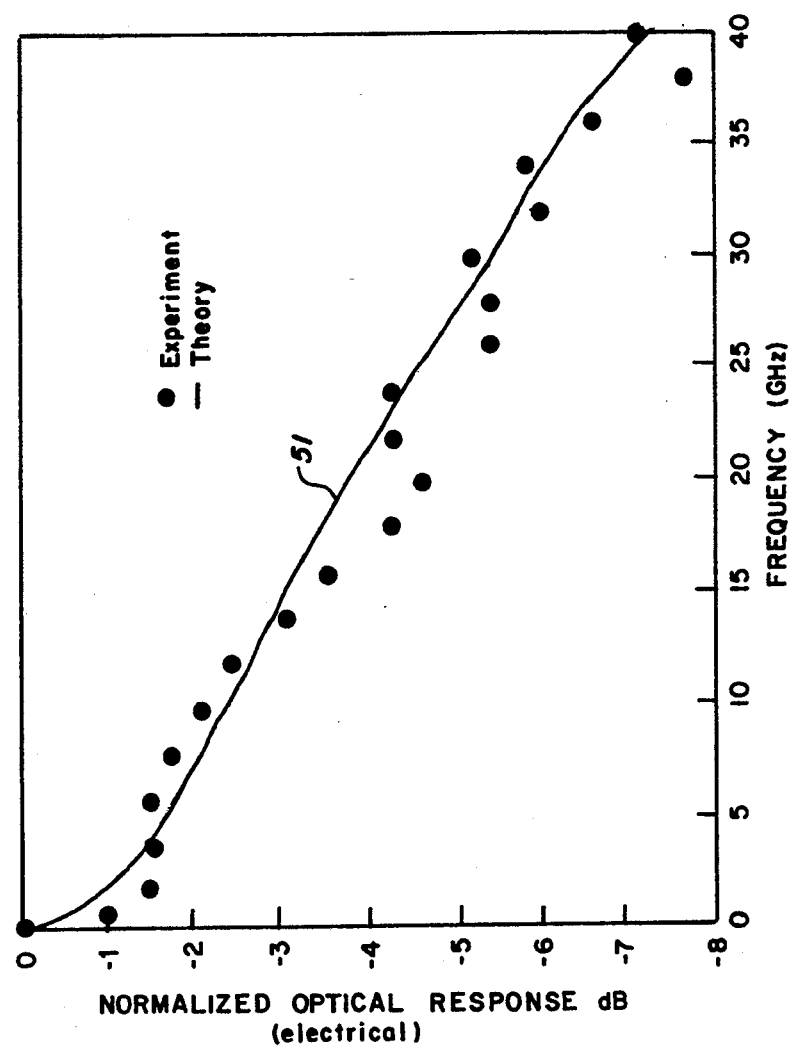

BROADBAND, LOW DRIVE VOLTAGE, ELECTROOPTIC, INTERGRATED OPTICAL MODULATOR

1. Field of the Invention

The present invention relates to integrated optical modulators and particularly to a thick electrode coplanar waveguide (CPW) structure on a thin substrate for the implementation of a broadband, traveling wave, electro-optic integrated optical modulator with low drive voltage.

2. Description of the Related Art

High speed, broad bandwidth integrated optical modulators are made by constructing a traveling wave coplanar microwave electrode structure on the top surface of the modulator, typically made from $LiNbO_3$. The optical phase or amplitude modulation results from an interaction between the optical wave in an optical waveguide and the microwave wave in its coplanar microwave waveguide. Bandwidth is limited by optical-microwave phase mismatch (the two waves typically travel at different velocities, depending on the design of the device), by RF (radio frequency) loss in the electroplated gold electrode structure, and by electrical coupling between the coplanar microwave mode and leaky substrate modes. Two recent approaches have been proposed for achieving optical-microwave phase match and, thus, broader bandwidth. Both of these approaches reduce the microwave effective index, so that it is nearly equal to the optical effective index, by increasing the air capacitance-to-total capacitance ratio. In the first proposed approach, the reduction in the microwave effective index is accomplished by the use of an additional shielding plane on top of the structure. In the second proposed approach, the reduction in the microwave effective index is accomplished by using a thick ($\sim 15$ $\mu$m) electrode structure with a coplanar strip (CPS) electrode arrangement. Both of these arrangements achieve near phase match, but with disadvantages.

The disadvantage in the first proposed approach is that the shielding plane is difficult to fabricate. The disadvantage in the second proposed approach is that, as proposed, it does not solve the problem of coupling between the coplanar mode of the coplanar waveguide electrode structure and a substrate mode of the substrate which results in large microwave loss dips and inhibits the goal of true broadband operation.

SUMMARY OF THE INVENTION

It is therefore an object of the invention to provide a high speed modulator for modulating the phase of a light beam.

Another object of the invention is to provide a high speed modulator for modulating the intensity of a light beam.

Another object of the invention is to provide a high speed phase modulator for modulating the phase of a light beam at a frequency in the range from 0 Hz to substantially 40 GHz.

Another object of the invention is to provide a high speed intensity modulator for modulating the intensity of a light beam at a frequency in the range from 0 Hz up to substantially 40 GHz.

Another object of the invention is to provide a relatively thick electrode coplanar waveguide structure on a relatively thin substrate for the construction of a broadband, traveling wave, electro-optic modulator.

A further object of the invention is provide a broadband, traveling wave, electro-optic modulator which allows a phase matched interaction between microwave and optical waves without a shielding plane and without microwave loss to substrate modes.

These and other objects of this invention are achieved in a preferred embodiment by providing a broadband, low drive voltage, electro-optic modulator comprising: a substrate having substrate modes, and having an optical waveguide adapted to receive and transmit light therethrough in a first direction and with a first phase velocity; a buffer layer disposed on the substrate; and a coplanar waveguide electrode structure having a coplanar mode having a thickness of between 12 $\mu$m and 20 $\mu$m, and being disposed on the buffer layer for receiving an electrical signal propagating therethrough in the first direction with a second phase velocity to modulate the light in the optical waveguide at a frequency in the range from 0 Hz up to substantially 40 GHz, the coplanar waveguide electrode structure being implemented so that the second phase velocity of the electrical signal is substantially equal to the first phase velocity, and the substrate has a sufficiently small thickness so that coupling between the coplanar mode of the coplanar waveguide electrode structure and any one of the substrate modes of the substrate substantially does not occur over a desired frequency bandwidth of operation within the range from 0 Hz up to substantially 40 GHz.

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designate identical or corresponding parts throughout the several views and wherein:

FIG. 2A illustrates an exemplary Z-cut $LiNbO_3$ substrate from which was derived the dispersion curve for the $TM_0$(cond) substrate mode shown in FIG. 2;

FIG. 2B illustrates an exemplary X- or Y-cut $LiNbO_3$ substrate;

FIGS. 3A and 3B show electrical transmission ($S_{21}$) plotted against frequency for different substrate thicknesses of CPS devices;

FIGS. 3C and 3D show electrical transmission ($S_{21}$) plotted against frequency for different substrate thicknesses of CPW devices;

FIG. 9A illustrates the electrical transmission through coplanar microwave waveguides; and FIG. 9B illustrates the normalized optical response of the device of FIG. 4 or FIG. 6 in dB of electrical power as a function of frequency.

DETAILED DESCRIPTION OF THE PREFERRED EMBODIMENTS

Figure 1A:
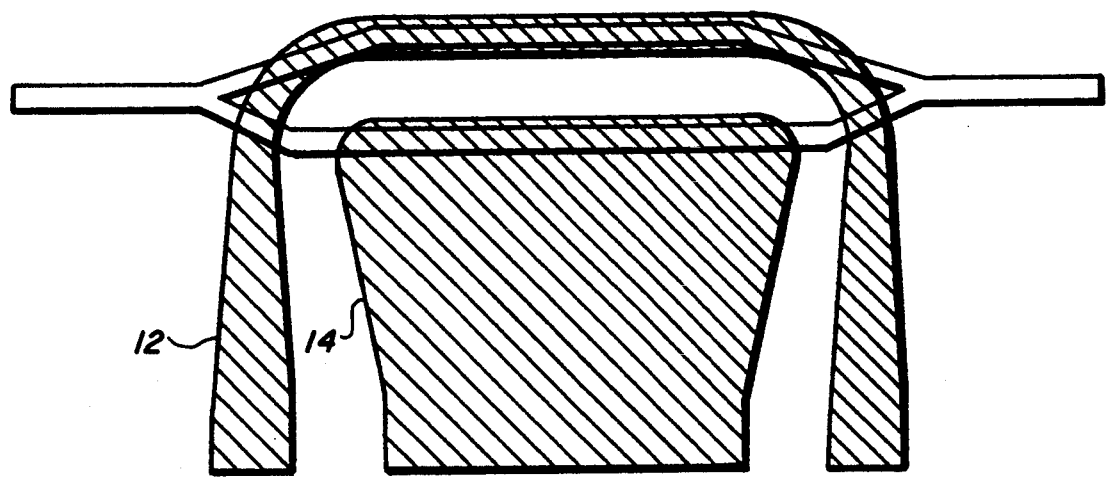
FIG. 1A illustrates a coplanar strip (CPS) electrode structure.
Figure 1B:
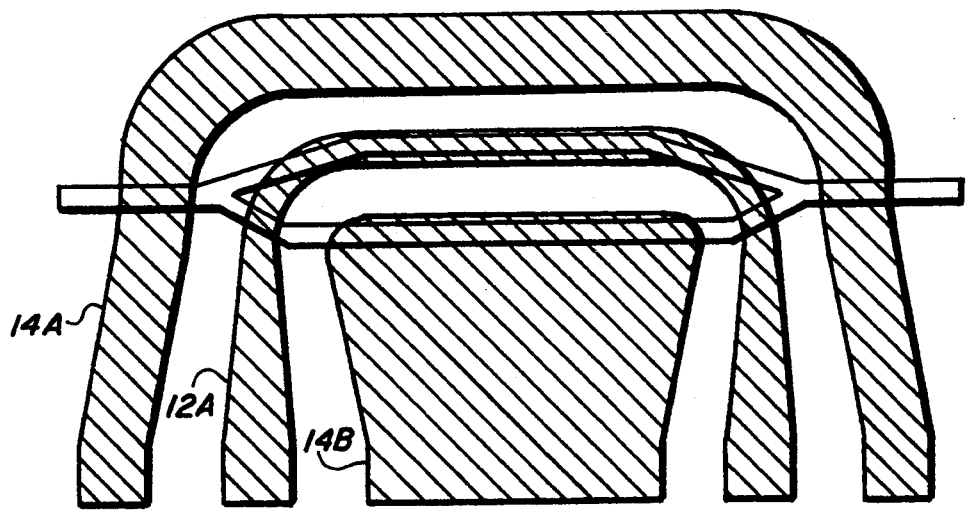
FIG. 1B illustrates a coplanar waveguide (CPW) electrode structure.

Referring now to FIGS. 1A and 1B of the drawings, FIG. 1A illustrates an exemplary coplanar strip (CPS) electrode structure in an exemplary Mach Zehnder interferometer modulator, while FIG. 1B illustrates an exemplary coplanar waveguide (CPW) electrode structure in an exemplary Mach Zehnder interferometer modulator.

Physically the CPS electrode structure of FIG. 1A has a hot electrode 12, to which a modulating signal is applied (not shown), and a single ground plane or grounded electrode 14 on one side of the hot electrode 12. On the other hand, the CPW electrode structure of FIG. 1B has a hot central electrode 12A, to which a modulating signal is applied (not shown), and two ground planes or grounded electrodes 14A and 14B on opposite sides of the hot central electrode 12A. The major physical difference between the CPS and CPW electrode structures is that the CPS electrode structure of FIG. 1A lacks a second ground plane or grounded electrode. This physical difference results in a crucial operational difference between the use of the coplanar strip (CPS) electrode structure of FIG. 1A and the use of the coplanar waveguide (CPW) electrode structure of FIG. 1B in an integrated optic modulator. The advantage of the CPW structure of FIG. 1B over the CPS structure of FIG. 1A will be explained by now referring to FIG. 2 and FIGS. 3A through 3D.

Figure 2:
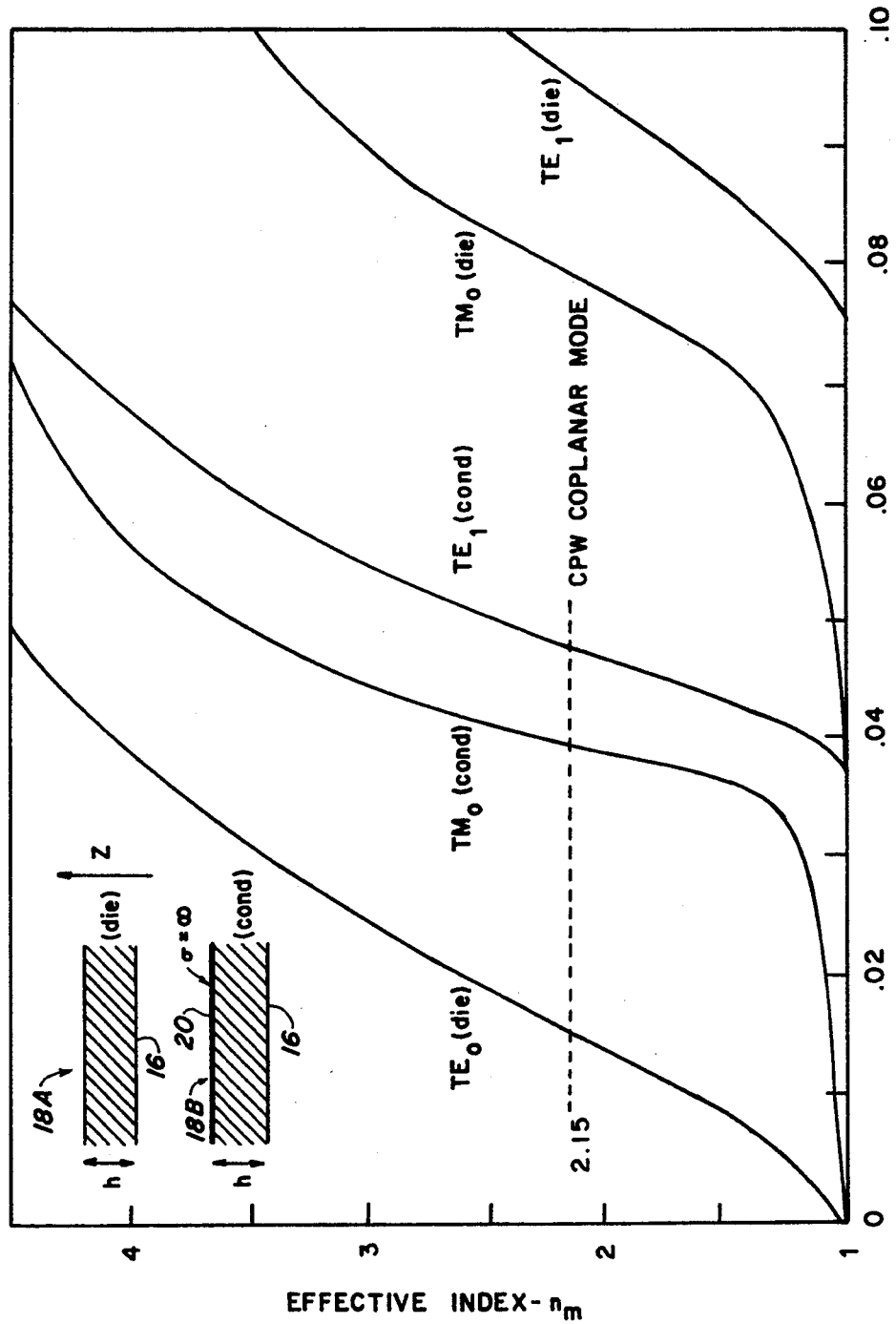
FIG. 2 illustrates dispersion curves for substrate modes of Z-cut lithium niobate ($LiNbO_3$) slabs or substrates.

FIG. 2 illustrates dispersion curves for substrate modes of Z-cut lithium niobate (LiNbO$_3$) slab (shown in inserts 18A and 18B), which LiNbO$_3$ slab represents a dielectric substrate 16, and where air (having an index=1) is the material under the LiNbO$_3$ substrate 16. Two different conditions are shown in FIG. 2. One condition is with a metal coating 20 on the upper surface of the dielectric substrate 16, while the other condition is without the metal coating 20 on the upper surface of the dielectric substrate 16. So the effective index $n_m$ of the guided modes of the Z-cut LiNbO$_3$ slab is plotted against the ratio of $h/\lambda_0$, where h is the substrate thickness and $\lambda_0$ is the free space wavelength.

Shown in FIG. 2 are five substrate modes, respectively labeled TE$_0$(die), TM$_0$(cond), TE$_1$(cond), TM$_0$(die) and TE$_1$(die), where:

TE$_0$ (transverse electric) means that the electric field is parallel to the plane of the slab (and the magnetic field is perpendicular to the plane of the slab), TM$_0$(cond) represents the TM$_0$(cond) substrate mode for a Z-cut LiNbO$_3$ substrate, TE$_1$(cond) represents the TE$_1$(cond) substrate mode for a Z-cut LiNbO$_3$ substrate.

the subscripts 0 and 1 refer to the order of the substrate mode, with 0 and 1 respectively representing the first order mode and the second order mode, (die) represents an approximation of the CPS structure based on the assumption that substantially no metal is disposed on the top of the dielectric substrate, (cond) represents the CPW structure where metal (a conductor) is disposed on the top of the dielectic substrate, 2.15=the optical index in LiNbO$_3$ at a wavelength of 1.3 $\mu$m, h=the thickness of the substrate, $\lambda_0$=free space microwave wavelength, $n_m=n_m$(subs)=the effective index of substrate mode, and $n_m$(CPW)=the effective index of the CPW coplanar mode (which for Z-cut LiNbO$_3$=2.15 at 1.3 $\mu$m when optical-microwave phase match is achieved).

It should be noted at this time that it has been known in the prior art that microwave leakage (loss dips in transmission) is due to a microwave coupling between the coplanar mode and a substrate mode bounded by the top and bottom surfaces of the substrate. In microwave terminology this is called a surface wave. However, for purposes of this description, the optical terminology of a substrate mode will be used. Although this microwave coupling has been known in the microwave area, it apparently has not been appreciated in the optical modulator area. The frequency at which the microwave coupling, and thus the microwave loss, begins depends on the thickness of the substrate and the dispersion behavior of the substrate mode. It is here where there is a crucial difference between the use of the coplanar strip (CPS) electrode structure of FIG. 1A and the use of a coplanar waveguide (CPW) electrode structure of FIG. 1B. It should be recalled that the CPW structure of FIG. 1B has ground planes 14A and 14B on both sides of the central electrode 12A, whereas the CPS structure of FIG. 1A has a ground plane 14 on only one side of the electrode 12. The dispersion curves for the Z-cut LiNbO$_3$ substrate 16 (shown in inserts 18A and 18B of FIG. 2) are different, depending on whether the upper surface of a substrate 16 is coated with the metal 20 (insert 18B) or is not coated with the metal 20 (insert 18A).

FIG. 2 shows that the TE$_0$(die) substrate mode of the non-metal coated substrate 16 of insert 18A occurs at a lower frequency than for the TM$_0$(cond) substrate mode of the metal coated substrate 16 of insert 18B. From FIG. 2, it can be determined that the problem of coupling between the coplanar mode of the coplanar waveguide electrode structure and a substrate mode of the substrate can be solved by using a thick electrode CPW structure (wherein the metal of the thick electrode CPW structure substantially coats the entire top surface) and by making the substrate thickness sufficiently thin that microwave leakage will not occur within the bandwidth of interest. The required thickness of the electrode structure for optical-microwave phase match can be calculated separately by known techniques (to be discussed later).

As stated before, the dispersion curves shown in FIG. 2 apply to the specific cases where Z-cut slabs or substrates of LiNbO$_3$ are utilized and air is the material underneath each of the LiNbO$_3$ substrates. In these cases the effective index ($n_m$) of the CPW coplanar mode is adjusted to be close to 2.15.

It will be recalled that microwave leakage (loss dips in transmission) is due to a microwave coupling between the coplanar mode and a substrate mode bounded by the top and bottom surfaces of the substrate. To avoid such microwave leakage it is important that the substrate thickness h be sufficiently small at a given $\lambda_0$ so that the following equation is satisfied:

$$n_m(\text{subs}) \leq n_m(\text{CPW}) \quad (1)$$

which for Z-cut LiNbO$_3$ the $n_m(\text{CPW}) \approx 2.15$ at a wavelength of 1.3 $\mu$m when optical-microwave phase match is achieved.

Since h and $\lambda_0$ are known, h/$\lambda_0$ can be readily calculated and then the effective index of the substrate mode $n_m(\text{subs})$ can be determined from the dispersion curves in FIG. 2. For example, if h/$\lambda_0 = 0.04$, then the effective index $n_m(\text{subs})$ of the TM$_0$(cond) substrate mode for the Z-cut LiNbO$_3$ substrate would be about 2.5. Since $n_m(\text{CPW}) = 2.15$ and $n_m(\text{subs}) = 2.5$, $n_m(\text{subs})$ would not be $\leq n_m(\text{CPW})$ and therefore microwave losses would result when h/$\lambda_0 = 0.04$. To prevent such a microwave loss, h (the substrate thickness) would have to be thinned until the relationship shown in Equation (1) is satisfied across a desired bandwidth. When this relationship is satisfied, substantially no microwave leakage occurs across that desired bandwidth.

There are several steps that have to be taken to determine the geometry of the broadband, travelling wave, electro-optic integrated optical modulator of the present invention which contains the thick electrode coplanar (CPW) structure on a thin substrate. After the optical index is determined:

1. The coplanar microwave index has to be made equal to the optical index (to be explained in discussion of FIG. 8), and 2. Then the substrate must be thinned so that the effective index (or microwave index) of the substrate mode is $\leq$ the effective index (or microwave index) of the CPW coplanar mode. (See Equation (1).)

Referring to FIGS. 2A and 2B, it will now be explained how the proper thickness can be determined for any suitable Z-cut substrate 19A and for any suitable X- or Y-cut substrate 19B, with each of the substrates 19A and 19B having a metal coating 20 on the upper surface of the substrate. For a more universal application, the following Equations (2) and (3) will also be used in this explanation instead of the dispersion curves of FIG. 2.

EQUATIONS FOR LEAKY MODE LOSS

For the Z-cut case: (TM$_0$ (cond)):

$$\frac{h}{\lambda_0} = \frac{\tan^{-1}\left[\frac{n_e n_0}{n_3^2}\left(\frac{n_m^2 - n_3^2}{n_e^2 - n_m^2}\right)^{\frac{1}{2}}\right]}{2\pi\left(\frac{n_0}{n_e}\right)(n_e^2 - n_m^2)^{\frac{1}{2}}} \quad (2)$$

For the X- or Y-cut case: (TM$_0$(cond)):

$$\frac{h}{\lambda_0} = \frac{\tan^{-1}\left[\frac{n_e n_0}{n_3^2}\left(\frac{n_m^2 - n_3^2}{n_0^2 - n_m^2}\right)^{\frac{1}{2}}\right]}{2\pi\left(\frac{n_e}{n_0}\right)(n_0^2 - n_m^2)^{\frac{1}{2}}} \quad (3)$$

where:
h = substrate thickness
$\lambda_0$ = free space microwave wavelength
$n_0$ = ordinary index of substrate
$n_e$ = extraordinary index of substrate
$n_m$ = effective index of substrate mode
$n_3$ = index of material below substrate Each of the substrates 19A and 19B being respectively utilized in FIGS. 2A and 2B is a uniaxial crystal which has two indices of refraction, one for fields parallel to Z and the other for fields parallel to X or Y. The Equations 2 and 3 are for the two different orientations of the uniaxial crystal substrates shown in FIGS. 2A and 2B. More particularly, Equation (2) is for the Z-cut orientation shown in FIG. 2A, while Equation (3) is for the X- or Y-cut orientation shown in FIG. 2B. In addition, Equation (2) determines the ratio h/$\lambda_0$ as a function of the effective index $n_m$ for the TM$_0$(cond) substrate mode for the Z-cut substrate being used. In a similar manner, Equation (3) determines the ratio h/$\lambda_0$ as a function of the effective index $n_m$ for the TM$_0$(cond) substrate mode for the X- or Y-cut substrate being used.

Assuming that Equation (2) is being utilized during the implementation of the Z-cut substrate for an electro-optic integrated optical modulator of the invention, then the effective index of the CPW coplanar mode $n_m$(CPW) would be known. In addition, the values h, $\lambda_0$, $n_0$, $n_e$ and $n_3$ in Equation (2) would also be known. Only $n_m$ or $n_m$(subs), the effective index of the TM$_0$(cond) substrate mode, would not be known. By inserting the known values of h, $\lambda_0$, $n_0$, $n_e$ and $n_3$ into Equation (2), the remaining value of $n_m$(subs) can be determined and compared with $n_m$(CPW), the effective index of the CPW coplanar mode, to see if the relationship shown in Equation (1) [$n_m$(subs) $\leq n_m$(CPW)] is satisified. If the relationship is satisfied, then the substrate is thin enough. If the relationship is not satisfied, then h must be thinned until Equation (1) is satisfied.

In a similar manner, if Equation (3) is being utilized during the implementation of the X- or Y-cut substrate for an electro-optic integrated optical modulator of the invention, then the effective index of the CPW coplanar mode $n_m$(CPW) would be known. In addition, the values h, $\lambda_0$, $n_0$ and $n_3$ in Equation (3) would also be known. Only $n_m$ or $n_m$(subs), the effective index of the TM$_0$(cond) substrate mode, would not be known. By inserting the known values of h, $\lambda_0$, $n_0$ and $n_3$ into Equation (3), the remaining value of $n_m$(subs) can be determined and compared with $n_m$(CPW), the effective index of the CPW coplanar mode, to see if the relationship shown in Equation (1) [$n_m$(subs) $\leq n_m$(CPW)] is satisified. If the relationship is satisfied, then the substrate is thin enough. If the relationship is not satisfied, then h must be thinned until Equation (1) is satisfied.

EARLY TEST OF DEVICES

In an earlier experiment, a 10 $\mu$m thick electrode CPW structure and a 14 $\mu$m thick electrode CPS structure were each fabricated on Z-cut LiNbO$_3$ slabs or substrates 16 with a 0.9 $\mu$m thick SiO$_2$ buffer layer on the substrate. Hot electrode widths were 8 $\mu$m, gap widths between a hot electrode and its associated ground plane(s) were 15 $\mu$m, and ground planes were 2–3 mm wide. Finite element calculations indicated that those geometries should result in microwave indices near 2.4. These devices were fabricated on substrates 0.5 and 0.25 mm thick and 8 mm wide. The electrode interaction length was 2–4 cm.

The devices were tested on a Hewlett-Packard HP-8510C automatic network analyzer with the electrical transmission (S$_{21}$) shown in FIGS. 3A, 3B, 3C and 3D. The CPS devices showed loss dips beginning at 7 GHz for the device with the 0.5 mm thick substrate and at 14 GHz for the device with the 0.25 mm thick substrate. The CPW devices showed similar behavior at about 24 GHz for the device with the 0.5 mm thick substrate, but no significant dips at all out to 40 GHz for the device with the 0.25 mm thick substrate. The frequency at which mode coupling begins is referred to as $f_c$. For frequencies beyond $f_c$, it was verified that microwave power was transmitted to the outer edge of the substrate (parallel to the axis of the device) by perturbing the field at the edge with another slab of LiNbO$_3$, or by sawing off the edge and thus reducing the width of the substrate. These actions had the effect of changing the position of the loss dips with frequency but did not significantly affect $f_c$. Power was observed at the outer edge of the substrate all along the length of the device. The experimental results (Experiment) for $f_c$ for several devices of each type are listed in the following TABLE, along with computed (Model) values from FIG. 2 assuming $n_m = 2.4$.

TABLE

SUMMARY OF COMPUTED AND MEASURED FREQUENCIES

| Device | h (mm) | Substrate mode | $f_c$ (GHz) Model | $f_c$ (GHz) Experiment |
|---|---|---|---|---|
| CPW | 0.5 | TM$_0$ (cond) | 25 | 24–26 |
|  | 0.25 | TM$_0$ (cond) | 49 | >40 |
| CPS | 0.5 | TE$_0$ (die) | 11 | 7–8 |
|  | 0.25 | TE$_0$ (die) | 22 | 14–16 |

Thus, as shown in FIGS. 3A and 3C (or FIGS. 3B and 3D) and the TABLE, for the same thickness substrate the CPS structure shows in FIG. 3A (FIG. 3B) microwave leakage (loss dips in transmission) at lower frequencies than the CPW structure shows in FIG. 3C (FIG. 3D).

Figure 4:
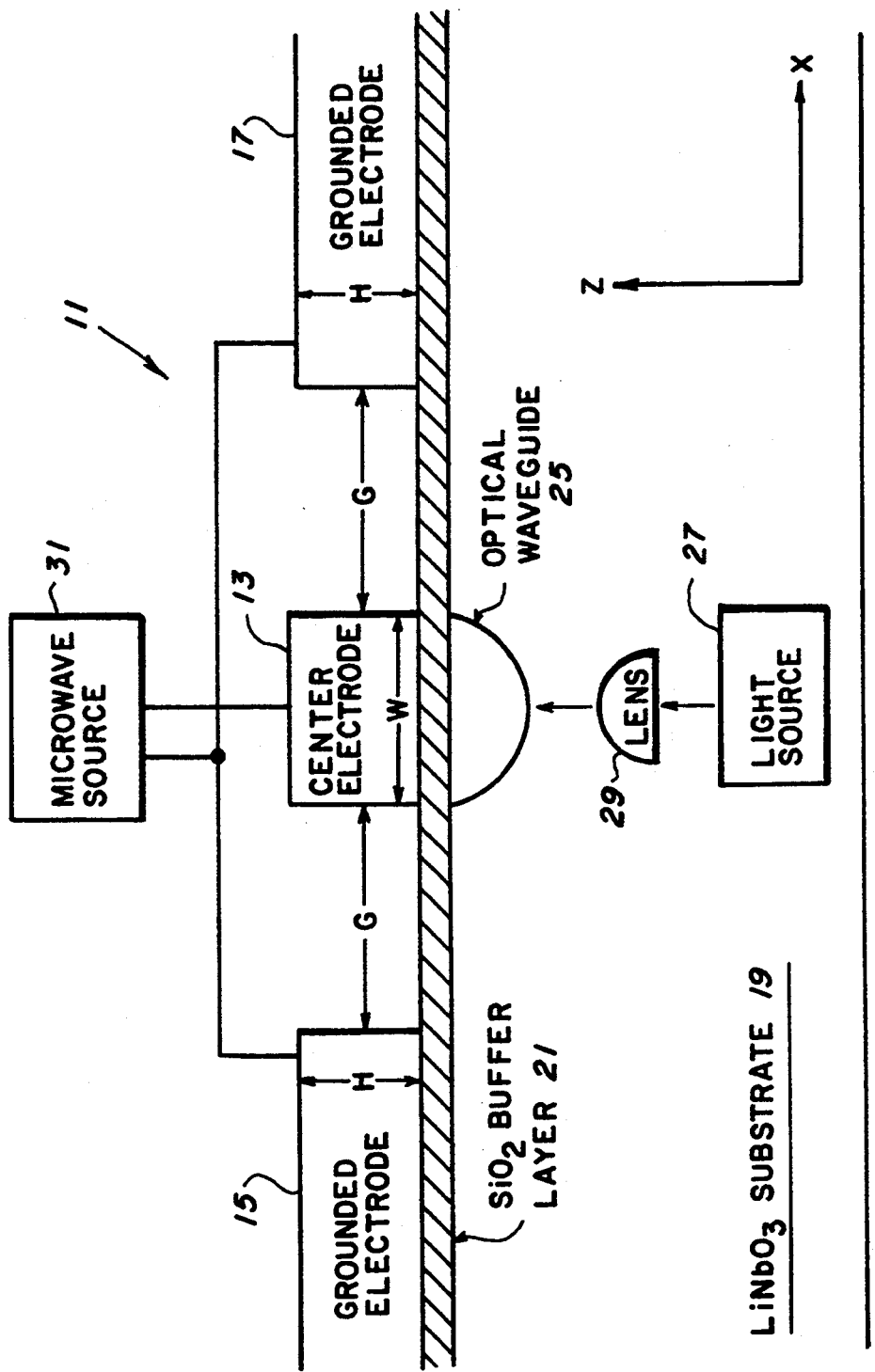
FIG. 4 illustrates a cross section of a phase modulator with coplanar waveguide electrodes in conformance with a first embodiment of the invention.
Figure 5:
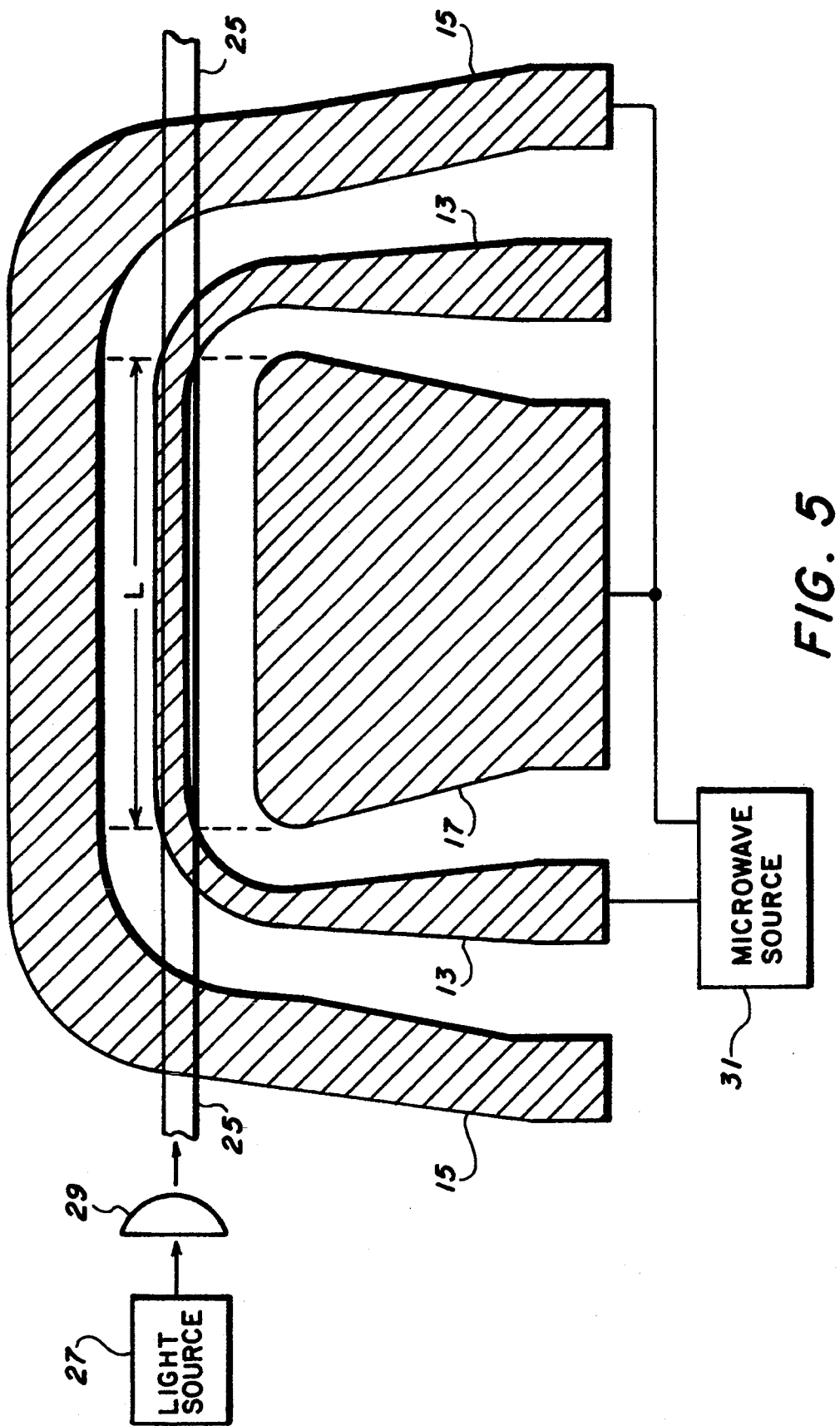
FIG. 5 illustrates a top view of the phase modulator of FIG. 4.

FIGS. 4 and 5 respectively show cross-sectional and top views of a high speed phase modulator with coplanar electrodes in conformance with a first embodiment of the invention.

In the phase modulator of FIGS. 4 and 5, a coplanar waveguide (CPW) structure 11, comprised of a center electrode 13 and ground planes or grounded electrodes 15 and 17 on both sides of the center electrode 13, is disposed on a thin substrate 19 of Z-cut lithium niobate (LiNbO$_3$) to avoid electrical leakage. Preferably the substrate 19 has a thickness of from 0.16 to 0.24 mm and a width of about 8 mm.

The electrodes 13, 15 and 17 are preferably made of gold and have thicknesses of from 10–20 μm and electrode 13 has an exemplary width of substantially 8 μm. The gap width G between the center electrode 13 and each of the grounded electrodes 15 and 17 is selected to be about 15 μm, while the grounded electrodes 15 and 17 are selected to be about 2–3 mm wide.

The substrate 19 has electro-optic effects, and is coated with an exemplary silicon dioxide (SiO$_2$) buffer layer 21 having an exemplary thickness of substantially 0.9 μm. In addition, the substrate 19 contains an optical waveguide 25 underneath the electrode 13. The optical waveguide 25 is formed by depositing a strip of Ti metal on the surface of the LiNbO$_3$ substrate 19 and diffusing it into the LiNbO$_3$ substrate 19 at high temperature by techniques well known in the art. This is done before the SiO$_2$ buffer layer 21 and the electrodes 13, 15 and 17 are deposited.

Portions of the electrodes 13, 15 and 17 extend in parallel paths over an electrode interaction region of length L (to be explained) which is parallel to the optical waveguide 25. The silicon dioxide buffer layer 21 isolates the optical field in the optical waveguide 25 from the metal electrodes 13, 15 and 17 of the coplanar waveguide structure 11 to prevent optical loss.

Figure 8:
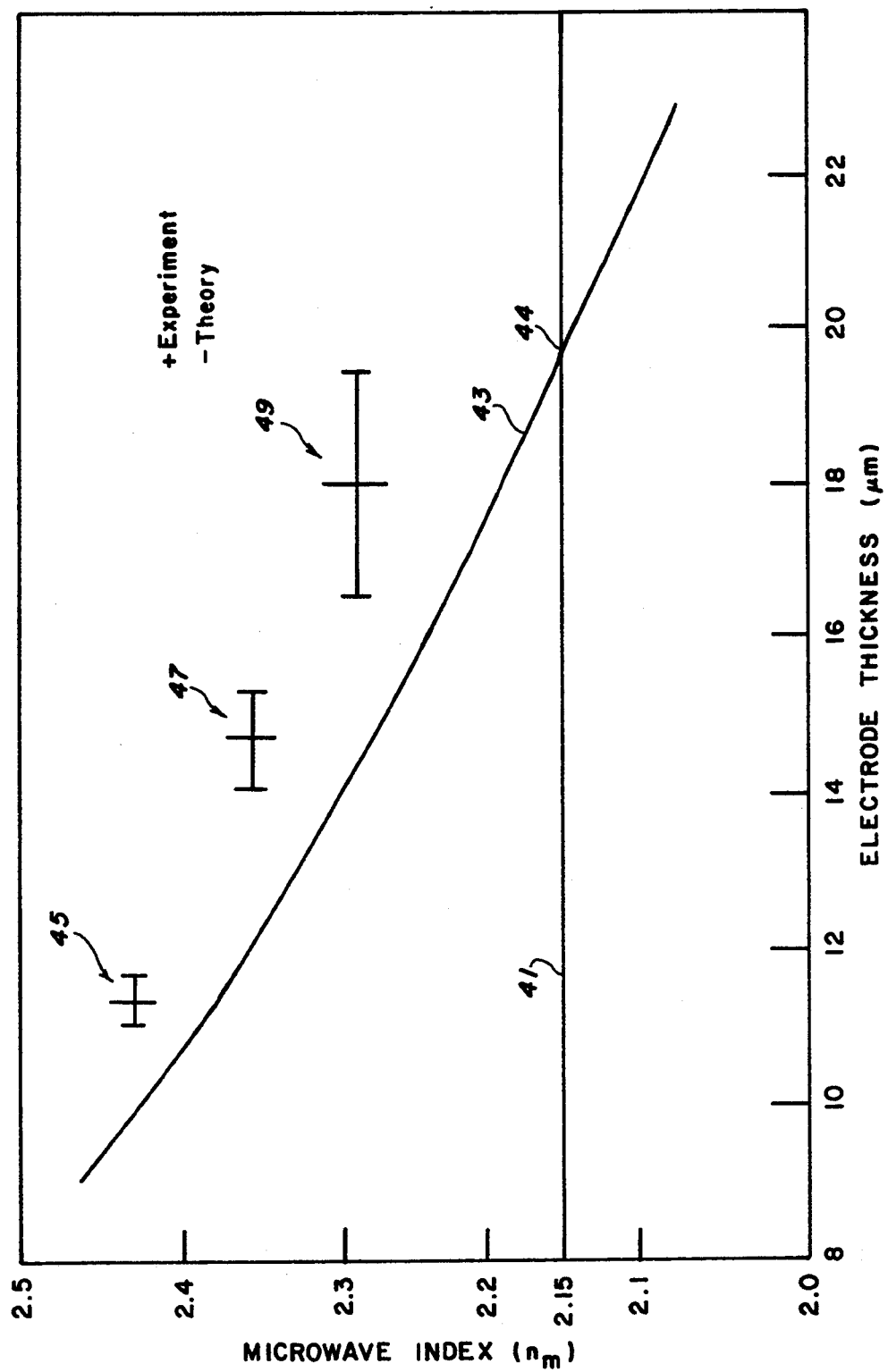
FIG. 8 illustrates a plot of the microwave index $n_m$ against electrode thickness, and a comparison of theoretical results with experimental results.

It should be noted at this time that the phase modulator of FIGS. 4 and 5 was fabricated with the above-specified geometries for a operation at an exemplary 1.3 μm. Calculations have indicated that these above-specified geometries should result in microwave indices $n_m$ between about 2.2 and about 2.4, as shown in FIG. 8 (to be explained).

In operation, 1.3 μm light from a light source 27, such as a laser, is focused by a lens 29 into the optical waveguide 25 and propagates through the optical waveguide 25. At the same time, a modulating microwave drive signal, at an arbitrary amplitude of up to 4 to 5 volts peak and at a frequency in the range from 0 Hz up to substantially 40 GHz, is applied from a microwave source 31 to the coplanar waveguide structure 11 (between the center electrode 13 and each of the grounded electrodes 15 and 17) and on the same side of the optical modulator as the exemplary 1.3 μm light is transmitted into the optical waveguide 25. The low drive voltage of up to 4 to 5 volts peak results in a highly efficient optical modulator. This modulating drive signal modulates the phase of the propagating light or optical wave at the frequency of the microwave drive signal. More particularly, the optical phase modulation results from an interaction between the optical wave in the optical waveguide 25 and the microwave drive signal in the coplanar waveguide structure 11.

The bandwidth of the phase-modulated optical signal is typically limited by optical-microwave phase mismatch (wherein the microwave wave and the optical wave travel at different velocities, depending on the design of the device). The phase matching or phase velocity matching in the invention will now be discussed.

Since the microwave drive signal and the light waves are both applied on the same side of the optical modulator, the microwave signal and the light waves propagate in the same direction through the electrode interaction region of the modulator. The direction of propagation for both the light waves and the microwave field is into the paper in FIG. 4, and from left to right in FIG. 5.

The coplanar waveguide structure 11 is designed with the above-discussed geometries so that the microwave field and the light waves propagate with substantially the same phase velocity when the light has a wavelength of about 1.3 μm. When the microwave field and the light waves have the same or matching phase velocities, the phase modulator of FIGS. 4 and 5 has the best broadband response characteristics.

The phase velocity match is determined by the effective indices of the optical and microwave field modes. The effective index of the optical mode is fixed by the index of refraction of the substrate 19. The effective index of the microwave field in the coplanar waveguide structure is determined by the geometry of the electrode structure of the optical modulator of FIGS. 4 and 5, the width W of the center electrode 13, the gap G between the center electrode 13 and each of the grounded electrodes 15 and 17, the height H and geometry of the electrodes 13, 15 and 17, the material and the dielectric constants of the buffer layer 21 and the substrate 19, and the thickness of the silicon dioxide buffer layer 21. These parameters are selected to make the effective index of the microwave field mode as close as possible to the effective index of the optical mode.

Of particular importance in producing a phase velocity match in the invention is the use of a thick electrode structure (of from 10–20 μm) on a coplanar waveguide (CPW) structure 11 (wherein the metal of which substantially coats the entire top surface of the buffer layer-coated substrate 19, as indicated in FIGS. 4 and 5) and the use of a substrate 19 having a thickness sufficiently thin (preferrably of from 0.16 to 0.24 mm) that microwave leakage will substantially not occur within the bandwidth of interest (up to 40 GHz).

Figure 6:
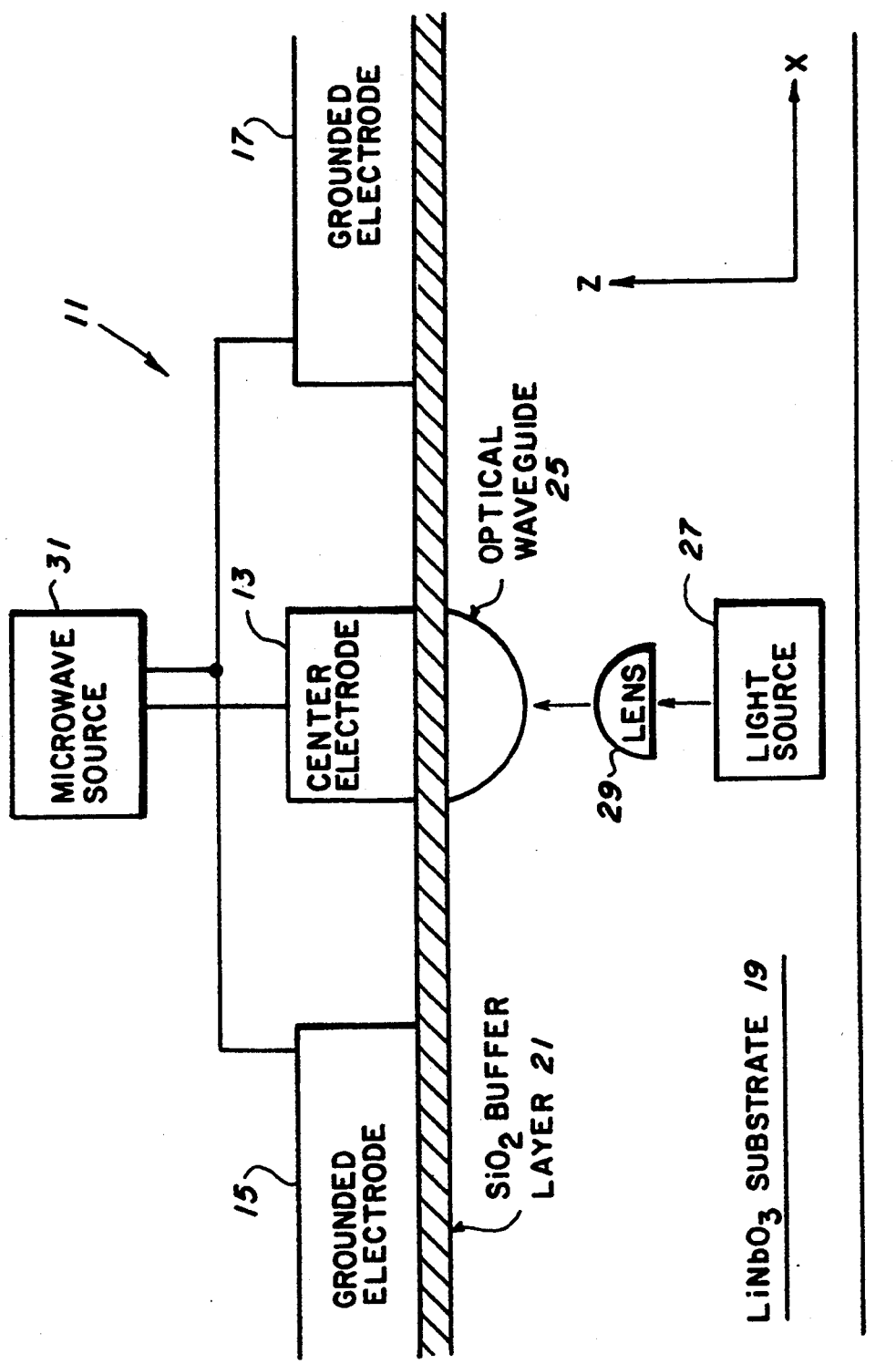
FIG. 6 illustrates a cross section of an intensity modulator with coplanar waveguide electrodes on a Mach-Zehnder interferometer in conformance with a second embodiment of the invention.
Figure 7:
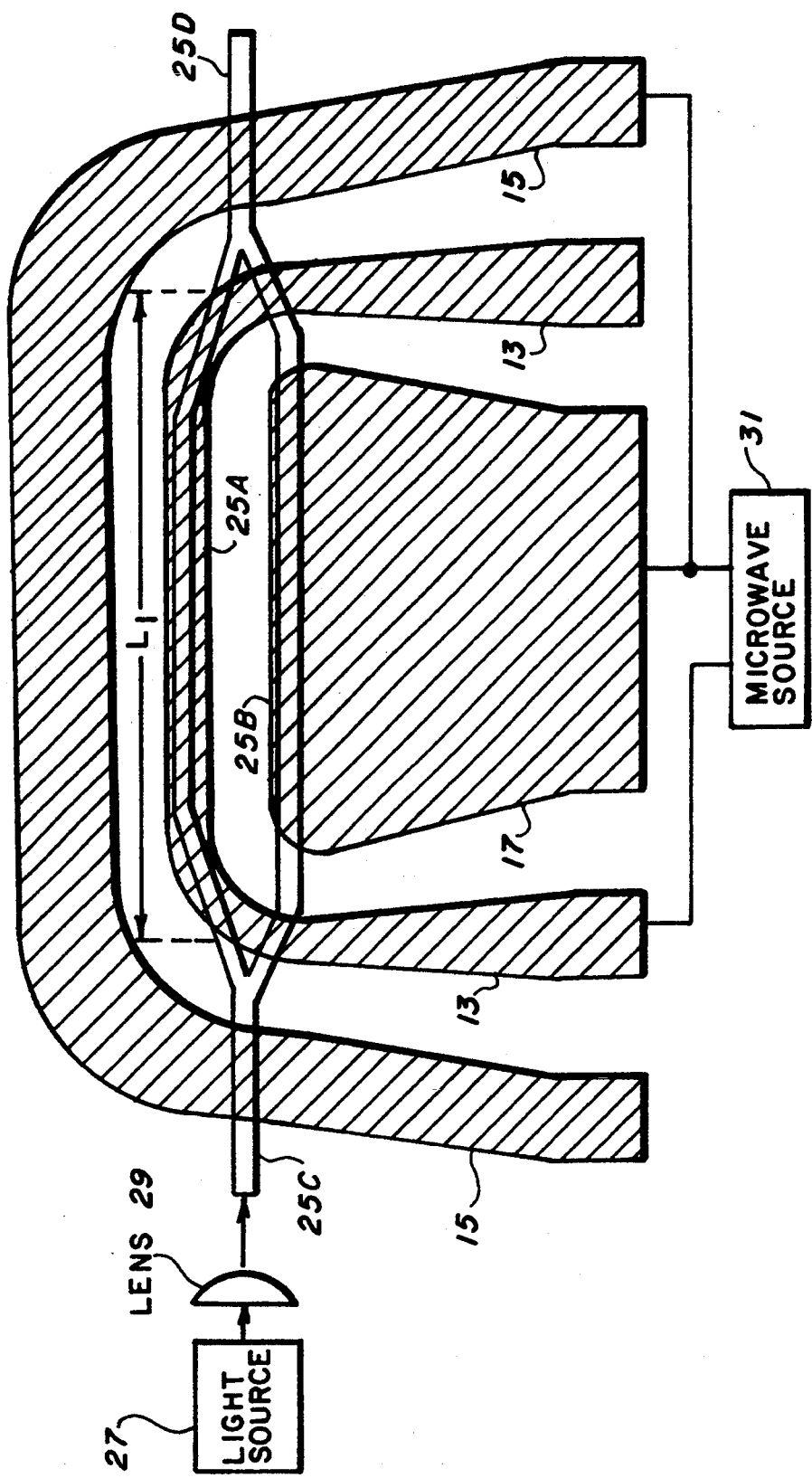
FIG. 7 illustrates a top view of the intensity modulator of FIG. 6.

Referring now to FIGS. 6 and 7, FIGS. 6 and 7 respectively show cross-sectional and top views of a high speed intensity modulator with coplanar electrodes in conformance with a second embodiment of the invention. FIGS. 6 and 7 are respectively substantially the same as FIGS. 4 and 5, except that they are cross-sectional and top views of a high speed Mach Zehnder interferometer modulator instead of just the phase modulator of FIGS. 4 and 5. The Mach Zehnder interferometer modulator of FIGS. 6 and 7 produces an intensity modulation at its output.

The Mach-Zehnder interferometric modulator of FIGS. 6 and 7 is fabricated in a manner similar to the fabrication of the phase modulator of FIGS. 4 and 5. More particularly, the Mach-Zehnder interferometer is used with a coplanar waveguide (CPW) structure 11 on a thin substate 19 of z-cut LiNbO$_3$ to avoid electrical leakage. The thickness of gold electrodes 13, 15 and 17 are varied from 10–20 μm. The substrate 19 is coated with a 0.9 μm SiO$_2$ buffer layer 21. The widths of the electrode 13 is 8 μm, the gap widths G are 15 μm and the ground planes 15 and 17 are 2–3 mm wide. In addition, the optical waveguide 25 of FIG. 4 is replaced by optical waveguide arms 25A and 25B respectively disposed in the substrate 19 respectively underneath the center electrode 13 and the ground plane or grounded electrode 17, as shown in FIG. 6. The optical waveguide arms 25A and 25B are formed by selectively applying strips of Ti metal on the surface of the LiNbO$_3$ substrate 19 and diffusing them into the LiNbO$_3$ substrate at room temperature by techniques well known in the art. This is done before the SiO$_2$ buffer layer 21 and the electrodes 13, 15 and 17 are deposited on the substrate 19.

The optical waveguide arms 25A and 25B are optically coupled together at one end to an input waveguide 25C and at a second end to an output waveguide 25D to form a Mach-Zehnder interferometer configuration, as shown in FIG. 7.

It should be noted that the FIGS. 4–7 are shown for a Z-cut LiNbO$_3$ substrate, where the Z-axis is normal to the plane of the LiNbO$_3$ substrate. (See insert 18A in FIG. 2.) For an X- or Y-cut LiNbO$_3$ substrate 19 in FIG. 4, the optical waveguide 25 would be similarly formed in the substrate 19 (as discussed before), but it would be located between the center electrode 13 and one of the grounded electrodes 15 and 17. Similarly, for an X- or Y-cut LiNbO$_3$ substrate 19 in FIG. 6, the optical waveguide arms 25A and 25B would be similarly formed in the substrate 19 (as discussed before), but the waveguide arm 25A would be located between the center electrode 13 and the grounded electrode 15, while the waveguide arm 25B would be located between the center electrode 13 and the grounded electrode 17.

The operation of the second embodiment of FIGS. 6 and 7 is substantially the same as the operation of the first embodiment of FIGS. 4 and 5, with the following exceptions. Light at the exemplary 1.3 μm wavelength from the light source 27 is focused by the lens 29 into the input waveguide 25C and is divided into the optical waveguide arms 25A and 25B of the interferometer. At the same time, a modulating microwave drive signal, at an arbitrary amplitude of up to 4 to 5 volts peak and at a frequency in the range from 0 Hz up to substantially 40 GHz, is applied from the microwave source 31 to the coplanar waveguide structure 11 (between the center electrode 13 and each of the grounded electrodes 15 and 17) and on the same side of the optical modulator as the exemplary 1.3 μm light is transmitted into the optical waveguide 25. The low drive voltage of up to 4 to 5 volts results in a highly efficient optical modulator.

The modulating drive signal modulates the light or optical waves in the waveguide arms 25A and 25B. The light in the two arms 25A and 25B is phase shifted in opposite directions before it is recombined in the output waveguide 25D to produce an output beam which contains intensity or amplitude modulation. It is the modulating microwave drive signal which modulates the intensity of the light in the interferometer at the frequency of the microwave drive signal. More particularly, the optical intensity or amplitude modulation results from an interaction between the optical wave in the optical waveguides 25A and 25B and the microwave drive signal in the coplanar waveguide structure 11.

The object of velocity matching in the invention is to implement the optical phase modulator of FIGS. 4 and 5 or the optical intensity modulator of FIGS. 6 and 7 so as to cause the velocity of the microwave wave to be the same as or substantially equal to the velocity of the optical wave. That will result in an improved optical response for the optical modulator. The velocity of the optical wave is the velocity of light divided by the optical index, while the velocity of the microwave wave is the velocity of light divided by the microwave index.

Three different optical modulator devices were fabricated on substrates 19 that were 0.16–0.25 mm thick and 8 mm wide and with the remaining geometries specified above for the second embodiment of FIGS. 6 and 7. More specifically, as indicated in FIG. 8, the thicknesses of the electrodes 13, 15 and 17 on each of the substrates 19 (and the associated microwave indices) of the three above-noted optical modulators were about 11.5 μm (and about 2.44 $n_m$), about 14.6 μm (and 2.37 $n_m$) and about 18 μm (and about 2.29 $n_m$). The electrode interaction length $L_1$ (FIG. 7) was 24 mm. Finite element calculations indicated that these geometries should result in microwave indices $n_m$ between 2.2 and 2.4, as shown in FIG. 8. FIG. 8 will now be discussed.

FIG. 8 illustrates a plot of the CPW microwave index $n_m$ against electrode thickness, and a comparison of theoretical results with experimental results. More specifically, FIG. 8 shows the optical index at 2.15, as represented by the horizontal line 41. FIG. 8 also shows a calculated version of a coplanar waveguide microwave (or effective) index of the CPW coplanar mode, as represented by the sloping line 43, as a function of the thickness of the electrodes 13, 15 and 17 for the above-specified geometries. FIG. 8 also shows three data points 45, 47 and 49 for the above-noted three fabricated devices of different electrode thicknesses. Note that the microwave index of each of these data points 45, 47 and 49 decreases as the associated electrode thickness increases. So FIG. 8 shows how well each of the three devices is velocity matched. Note that the line 41 (representing an optical index of 2.15) and the line 43 (representing the CPW microwave index vs. electrode thickness of the electrodes 13, 15 and 17) intersect at about an electrode (13, 15 and 17) thickness of about 20 $\mu$m. An exact velocity match would be at a microwave index of 2.15, which is the optical index for a wavelength of 1.3 $\mu$m. Thus, to obtain an exact velocity match, the coplanar waveguide microwave (or effective) index 43 has to be made equal to the optical index 41. As shown in FIG. 8, this occurs at the point 44 where the lines 41 and 43 intersect.

The coplanar microwave index of the CPW coplanar mode for a given geometry of the electrode structure is determined by the thickness of the electrodes 13, 15 and 17. Therefore, the electrodes 13, 15 and 17 must be thick enough so that the coplanar waveguide microwave index is equal to the optical index in the uniaxial crystal (which is 2.15 in $LiNbO_3$). However, it should be realized that an exact velocity match could be obtained for a different optical index (for a different wavelength and/or for a different crystal material) by following a similar procedure.

The optical modulator of the invention can be implemented to operate with any optical wavelength, but the above-discussed optical modulators of the embodiment of FIGS. 4 and 5 and the embodiment of FIGS. 6 and 7 were implemented to operate at an optical wavelength of 1.3 $\mu$m.

Referring now to FIGS. 9A and 9B, FIG. 9A illustrates the electrical transmission through the coplanar microwave waveguide structure 11 (FIGS. 6 and 7 or FIGS. 4 and 5); and FIG. 9B illustrates the normalized optical response of the device of FIGS. 4 and 5 or of FIGS. 6 and 7 in dB of electrical power as a function of frequency.

FIG. 9A shows that the magnitude of $S_{21}$ in dB is plotted against frequency over the frequency range from 0 Hz to 40 GHz, where $S_{21}$ is a transmission parameter from a network analyzer used in the measurement. FIG. 9A basically indicates what the transmission of the optical modulator of the invention is in dB as a function of frequency.

FIG. 9B shows the normalized response of the optical modulator of the invention in dB of electrical power, not optical power, as a function of frequency over the frequency range from 0 Hz to 40 GHz. Experimental data points are shown about a theoretical normalized optical response line 51. Note that the normalized optical response decreases as an inverse function of the increase in frequency. With a velocity matched optical modulator the drop off with frequency will be minimized. Ideally a flat response over the frequency range from 0 Hz to 40 GHz is desired. However, FIG. 9B shows that the optical modulator of the invention that was tested only dropped about 7.5 dB over the frequency range from 0 Hz to 40 GHz, which is a very good response.

Therefore, what has been described in preferred embodiments of the invention is a broadband, electrooptic modulator which, in a first embodiment, comprises: a substrate having substrate modes, having electrooptic effects, and having a first optical waveguide adapted to receive and transmit light therethrough in a first direction and with a first phase velocity; a buffer layer disposed on the substrate; and a coplanar waveguide electrode structure having a coplanar mode and being disposed on the buffer layer for receiving an electrical signal propagating therethrough in the first direction with a second phase velocity to phase modulate the light in the optical waveguide at a frequency in the range from 0 Hz up to substantially 40 GHz. The substrate has a sufficiently small thickness so that coupling between the coplanar mode of the coplanar waveguide electrode structure and any one of the substrate modes of the substrate substantially does not occur over a desired frequency bandwidth of operation, and the coplanar waveguide electrode structure has a sufficiently large thickness so that the second phase velocity of the electrical signal is substantially equal to the first phase velocity. In a second embodiment of the invention an intensity modulator is produced by adding a second optical waveguide which, in combination with the first optical waveguide, forms an interferometer. The interaction of the electrical signal with the optical signal produces an intensity-modulated optical beam.

It should therefore readily be understood that many modifications and variations of the present invention are possible within the purview of the claimed invention. For example, the invention disclosed above is not limited to $LiNbO_3$ Ti diffused optical modulators, but is equally applicable to proton exchanged waveguide modulators or any other type of electro-optic or electro-absorption modulators that use coplanar traveling wave electrodes. The invention is also applicable to similar modulators fabricated on semiconductor substrates. It is therefore to be understood that, within the scope of the appended claims, the invention may be practiced otherwise than as specifically described.

What is claimed and desired to be secured by Letters Patent of the United States is:

1. A broadband, low drive voltage, electrooptic modulator comprising:

a substrate having substrate modes, having electrooptic effects and having at least one optical waveguide receiving and transmitting light therethrough in a first direction and with a first phase velocity;

a buffer layer disposed on said substrate; and a coplanar waveguide electrode structure having a coplanar mode, said coplanar waveguide electrode structure being disposed on said buffer layer and receiving an electrical signal propagating in the first direction with a second phase velocity to modulate the light in said at least one optical waveguide as a function of the amplitude and frequency of the electrical signal;

said substrate having a sufficiently small thickness so that coupling between the coplanar mode of said coplanar waveguide electrode structure and any one of the substrate modes of said substrate substantially does not occur over a desired frequency bandwidth of operation within the range from 0 Hz up to substantially 40 GHz, and said coplanar waveguide electrode structure having a sufficiently large thickness so that said first and second phase velocities are substantially equal over the desired frequency bandwidth of operation within the range from 0 Hz up to substantially 40 GHz.

2. A broadband, low drive voltage, electrooptic modulator comprising:

a substrate having substrate modes, having electrooptic effects, and having an optical waveguide receiving and transmitting light therethrough in a first direction and with a first phase velocity;

a buffer layer disposed on said substrate; and a coplanar waveguide electrode structure having a coplanar mode and being disposed on said buffer layer and receiving an electrical signal propagating therethrough in the first direction with a second phase velocity to phase modulate the light in said optical waveguide at a frequency in the range from 0 Hz up to substantially 40 GHz, said coplanar waveguide electrode structure having a sufficiently large thickness so that said second phase velocity of said electrical signal is substantially equal to said first phase velocity;

said substrate having a sufficiently small thickness so that coupling between the coplanar mode of said coplanar waveguide electrode structure and any one of the substrate modes of said substrate substantially does not occur over a desired frequency bandwidth of operation within the range from 0 Hz up to substantially 40 GHz.

3. The modulator of claim 2 wherein:

said substrate has a thickness of less than about 0.25 mm; and said coplanar waveguide electrode structure has a thickness of between about 12 $\mu$m and about 20 $\mu$m.

4. The modulator of claim 2 wherein:

said coplanar waveguide electrode structure comprises a center electrode and two grounded electrodes.

5. The modulator of claim 4 wherein:

each of said center and grounded electrodes is comprised of gold.

6. The modulator of claim 4 wherein:

said optical waveguide is disposed underneath said center electrode.

7. The modulator of claim 6 wherein:

said optical waveguide has a first width and said center electrode has a second width which is substantially equal to said first width.

8. The modulator of claim 2 wherein:

said substrate is comprised of lithium niobate.

9. The modulator of claim 2 wherein:

said buffer layer is comprised of silicon dioxide.

10. A broadband, low drive voltage, electrooptic modulator comprising:

a substrate having substrate modes, having electrooptic effects, and having an optical waveguide receiving and transmitting light therethrough in a first direction and with a first phase velocity;

a buffer layer disposed on said substrate; and a coplanar waveguide electrode structure having a coplanar mode and being disposed on said buffer layer and receiving an electrical signal propagating therethrough in the first direction with a second phase velocity to phase modulate the light in said optical waveguide at a frequency in the range from 0 Hz up to substantially 40 GHz, said coplanar waveguide electrode structure having a sufficiently large thickness so that said second phase velocity of said electrical signal is substantially equal to said first phase velocity, said coplanor waveguide electrode structure comprising a center electrode and two grounded electrodes, said optical waveguide being disposed between said center electrode and one of said grounded electrodes;

said substrate having a sufficiently small thickness so that coupling between the coplanar mode of said coplanar waveguide electrode structure and any one of the substrate modes of said substrate substantially does not occur over a desired frequency bandwidth of operation within the range from 0 Hz up to substantially 40 GHz.

11. A broadband, low drive voltage, electrooptic modulator comprising:

a substrate having substrate modes, having electrooptic effects, and having an optical waveguide receiving and transmitting light therethrough in a first direction and with a first phase velocity, said substrate being comprised of lithium niobate;

a buffer layer disposed on said substrate, said buffer layer being comprised of silicon dioxide; and a coplanar waveguide electrode structure having a coplanar mode and being disposed on said buffer layer and receiving an electrical signal propagating therethrough in the first direction with a second phase velocity to phase modulate the light in said optical waveguide at a frequency in the range from 0 Hz up to substantially 40 GHz, said coplanar waveguide electrode structure having a sufficiently large thickness so that said second phase velocity of said electrical signal is substantially equal to said first phase velocity, said coplanar waveguide electrode structure comprising a center electrode and two grounded electrodes;

said substrate having a sufficiently small thickness so that coupling between the coplanar mode of said coplanar waveguide electrode structure and any one of the substrate modes of said substrate substantially does not occur over a desired frequency bandwidth of operation within the range from 0 Hz up to substantially 40 GHz.

12. The modulator of claim 11 wherein:

said optical waveguide is disposed underneath said center electrode.

13. The modulator of claim 12 wherein:

said optical waveguide has a first width and said center electrode has a second width which is substantially equal to said first width.

14. The modulator of claim 11 wherein:

said optical waveguide is disposed between said center electrode and one of said grounded electrodes.

15. A broadband, low drive voltage, electrooptic modulator comprising:

a substrate having substrate modes, having electrooptic effects and having first and second optical waveguides receiving and transmitting light therethrough in a first direction and with a first phase velocity;

a buffer layer disposed on said substrate; and a coplanar waveguide electrode structure having a coplanar mode and being disposed on said buffer layer and receiving an electrical signal propagating therethrough in the first direction with a second phase velocity to intensity modulate the light in said optical waveguides at a frequency in the range from 0 Hz up to substantially 40 GHz, said coplanar waveguide electrode structure having a sufficiently large thickness so that said second phase velocity of said electrical signal is substantially equal to said first phase velocity;

said substrate having a sufficiently small thickness so that coupling between the coplanar mode of said coplanar waveguide electrode structure and any one of the substrate modes of said substrate substantially does not occur over a desired frequency bandwidth of operation within the range from 0 Hz up to substantially 40 GHz.

16. The modulator of claim 15 wherein:
said substrate has a thickness of less than about 0.25 mm; and
said coplanar waveguide electrode structure has a thickness of between about 12 $\mu$m and about 20 $\mu$m.

17. The modulator of claim 15 wherein:
said coplanar waveguide electrode structure comprises a center electrode and two grounded electrodes.

18. The modulator of claim 17 wherein:
each of said center and grounded electrodes is comprised of gold.

19. The modulator of claim 15 wherein:
said substrate is comprised of lithium niobate.

20. The modulator of claim 15 wherein:
said buffer layer is comprised of silicon dioxide.

21. A broadband, low drive voltage, electrooptic modulator comprising:
a substrate having substrate modes, having electrooptic effects and having first and second optical waveguides receiving and transmitting light therethrough in a first direction and with a first phase velocity;
a buffer layer disposed on said substrate; and
a coplanar waveguide electrode structure having a coplanar mode and being disposed on said buffer layer and receiving an electrical signal propagating therethrough in the first direction with a second phase velocity to intensity modulate the light in said optical waveguides at a frequency in the range from 0 Hz up to substantially 40 GHz, said coplanar waveguide electrode structure having a sufficiently large thickness so that said second phase velocity of said electrical signal is substantially equal to said first phase velocity, said coplanar waveguide electrode structure comprising a center electrode and two grounded electrodes, said first optical waveguide being disposed between said center electrode and a first one of said grounded electrodes, and said second optical waveguide being disposed between said center electrode and a second one of said grounded electrodes;
said substrate having a sufficiently small thickness so that coupling between the coplanar mode of said coplanar waveguide electrode structure and any one of the substrate modes of said substrate substantially does not occur over a desired frequency bandwidth of operation within the range from 0 Hz up to substantially 40 GHz.

22. A broadband, low drive voltage, electrooptic modulator comprising:
a substrate having substrate modes, having electrooptic effects and having first and second optical waveguides receiving and transmitting light therethrough in a first direction and with a first phase velocity;
a buffer layer disposed on said substrate; and
a coplanar waveguide electrode structure having a coplanar mode and being disposed on said buffer layer and receiving an electrical signal propagating therethrough in the first direction with a second phase velocity to intensity modulate the light in said optical waveguides at a frequency in the range from 0 Hz up to substantially 40 GHz, said coplanar waveguide electrode structure having a sufficiently large thickness so that said second phase velocity of said electrical signal is substantially equal to said first phase velocity, said coplanar waveguide comprising a center electrode and two grounded electrodes, said first optical waveguide being disposed underneath said center electrode and said second optical waveguide being disposed underneath one of said grounded electrodes;
said substrate having a sufficiently small thickness so that coupling between the coplanar mode of said coplanar waveguide electrode structure and any one of the substrate modes of said substrate substantially does not occur over a desired frequency bandwidth of operation within the range from 0 Hz up to substantially 40 GHz.

23. The modulator of claim 22 wherein:
said first optical waveguide has a first width;
said center electrode has a second width which is substantially equal to said first width;
said second optical waveguide has a third width which is substantially equal to said first width; and
said one of said grounded electrodes has a fourth width which is greater than said third width.

24. A broadband, low drive voltage, electrooptic modulator comprising:
a substrate having substrate modes, having electrooptic effects and having first and second optical waveguides receiving and transmitting light therethrough in a first direction and with a first phase velocity, said substrate being comprised of lithium niobate;
a buffer layer disposed on said substrate, said buffer layer being comprised of silicon dioxide; and
a coplanar waveguide electrode structure having a coplanar mode and being disposed on said buffer layer and receiving an electrical signal propagating therethrough in the first direction with a second phase velocity to intensity modulate the light in said optical waveguides at a frequency in the range from 0 Hz up to substantially 40 GHz, said coplanar waveguide electrode structure having a sufficiently large thickness so that said second phase velocity of said electrical signal is substantially equal to said first phase velocity, said coplanar waveguide electrode structure comprising a center electrode and two grounded electrodes;
said substrate having a sufficiently small thickness so that coupling between the coplanar mode of said coplanar waveguide electrode structure and any one of the substrate modes of said substrate substantially does not occur over a desired frequency bandwidth of operation within the range from 0 Hz up to substantially 40 GHz.

25. The modulator of claim 24 wherein:
said first optical waveguide is disposed underneath said center electrode; and
said second optical waveguide is disposed underneath one of said grounded electrodes.

26. The modulator of claim 25 wherein:
said first optical waveguide has a first width;
said center electrode has a second width which is substantially equal to said first width;

said second optical waveguide has a third width which is substantially equal to said first width; and
said one of said grounded electrodes has a fourth width which is greater than said third width.

27. The modulator of claim 24 wherein:
said first optical waveguide is disposed between said center electrode and a first one of said grounded electrodes; and
said second optical waveguide is disposed between said center electrode and a second one of said grounded electrodes.

* * * * *